United States Patent [19]

Dakin

[11] Patent Number: 4,707,670
[45] Date of Patent: Nov. 17, 1987

[54] PLL STABILIZED FREQUENCY MODULATOR WITH EXTENDED LOW FREQUENCY RANGE

[75] Inventor: W. Ray Dakin, Huntington Beach, Calif.

[73] Assignee: Optical Disc Corporation, Cerritos, Calif.

[21] Appl. No.: 836,111

[22] Filed: Mar. 4, 1986

[51] Int. Cl.[4] ............................................. H03C 3/09
[52] U.S. Cl. .................................... 332/19; 331/23; 455/113; 455/119
[58] Field of Search ................ 332/19, 30 V, 16 R; 331/23, 25; 455/42, 76, 112, 113, 119

[56] References Cited

U.S. PATENT DOCUMENTS 4,313,209 1/1982 Drucker .............................. 455/112
4,360,788 11/1982 Erps et al. ........................... 331/1 A Primary Examiner—Siegfried H. Grimm
Attorney, Agent, or Firm—Steven P. Brown

[57] ABSTRACT

A modulator including a voltage controlled oscillator (VCO) having its center frequency stabilized to a reference frequency using a phase locked loop in which the low frequency range is increased by using frequency translation techniques. The VCO output signal is translated relative to the phase locked loop feedback signal so that an increased frequency division ratio can be used in the feedback loop and the effective frequency deviation at the phase comparator can be reduced by an arbitrary factor. This has the effect of increasing the allowable deviation at a given information signal frequency by that arbitrary factor. Likewise, a given deviation can be maintained for input information frequencies which are an arbitrary fraction of the low end cutoff frequencies of conventional modulators.

10 Claims, 4 Drawing Figures

PLL STABILIZED FREQUENCY MODULATOR WITH EXTENDED LOW FREQUENCY RANGE

FIELD OF THE INVENTION

The present invention relates to the field of modulators for frequency modulating a carrier signal about a center frequency in accordance with an information signal. More specifically, the present invention relates to a modulator having its center frequency stabilized to a reference frequency using a phase locked loop. The disclosed modulator attains increased low frequency range using frequency translation techniques.

DESCRIPTION OF THE PRIOR ART

In FM information systems, voltage controlled oscillators (VCO's) are often used as modulators. However, the center frequency of a VCO is highly prone to drift.

One method for stabilizing the center frequency of a VCO is to sum the input information signal with a feedback signal generated by a phase comparator comparing the output of the VCO with a reference signal having a frequency at the desired center frequency, thus forming a phase locked loop (PLL). Naturally, in order for the system to be functional, the bandwidth of the PLL must be limited so that it lies below the bandwidth of the modulating information signal. In most applications, a frequency divider is also used in the loop so that a submultiple of the VCO output is compared to a submultiple of the desired carrier frequency. Such systems are extremely effective and relatively inexpensive, but they do have several drawbacks in certain situations.

In order to keep the phase locked loop from introducing unwanted frequency components into the information channel, it is necessary to operate the phase locked loop at a frequency outside of the frequency range of the input information. For most information systems, and audio information systems in particular, this means that the reference frequency used in the phase locked loop must be above the frequency range of the input information.

Additionally, the range of a phase comparator is limited, and in most cases is plus or minus 180°. Since the bandwidth of the phase locked loop is necessarily limited to be below the frequency range of the input information signal, each frequency variation of the VCO output caused by the input information causes a phase error at the phase comparator. The higher the amplitude of the input information signal, the greater the frequency deviation of the VCO, and the faster the phase error increases at the phase comparator. Furthermore, since the error will continue to increase until the frequency of the VCO swings back past the center frequency, the total phase error at the comparator is inversely proportional to the frequency of the input information signal. Accordingly, the limited range of the phase comparator places a deviation range limit on the modulator which is inversely proportional to the frequency of the information signal.

In certain applications, these limitations require undesirable bandwidth or amplitude limitation of the information signal to prevent nonlinear operation of the phase comparator.

SUMMARY OF THE PRESENT INVENTION

It is therefore an object of the present invention to provide a phase locked loop stabilized modulator having increased modulation range at low input frequencies.

It is a further object of the present invention to provide a PLL modulator specifically suited for producing the audio carriers for an optical video disc without requiring any bandwidth limiting of the input audio information and allowing full frequency deviation over the entire audio range.

The present invention satisfies these objects by employing a frequency translation of the VCO output signal relative to the loop signal so that an increased frequency division ratio can be used and the effective frequency deviation at the phase comparator can be reduced by an artibrary factor. This has the effect of increasing the allowable deviation at a given frequency by that arbitrary factor. Likewise, a given deviation can be maintained for input information frequencies which are an arbitrary fraction of the low end cutoff frequencies of conventional modulators.

In its broadest form, the present invention includes a voltage controlled oscillator responsive to a voltage varying with time input information signal, a reference source producing two reference signals, a phase locked loop stabilizing the center frequency of the VCO to a multiple of a first one of the reference signals, and a signal multiplier for multiplying the second reference signal by the output of the VCO. As can be appreciated, the output of the signal multiplier will include components at the sum and difference of the VCO output signal frequency and the second reference signal frequency. The frequencies of the reference signals are chosen so that the difference component output by the signal multiplier is the desired FM signal. A low pass filter may be used for removing the other components of the output signal.

The second reference signal is used to translate the frequency of the VCO relative to the loop frequency so that the percentage of deviation of the loop signal is an arbitrary fraction of what it would be in a conventional modulator. This reduces the phase error at the phase comparator by the same arbitrary fraction, thereby extending range of the phase comparator.

The first and second reference signals can be generated separately or can be produced from a single reference signal using frequency dividing or multiplying techniques.

Further aspects and advantages of the invention will become apparent in connection with the description of the following preferred embodiments.

DESCRIPTION OF THE PREFERRED EMBODIMENTS

Figure 1:
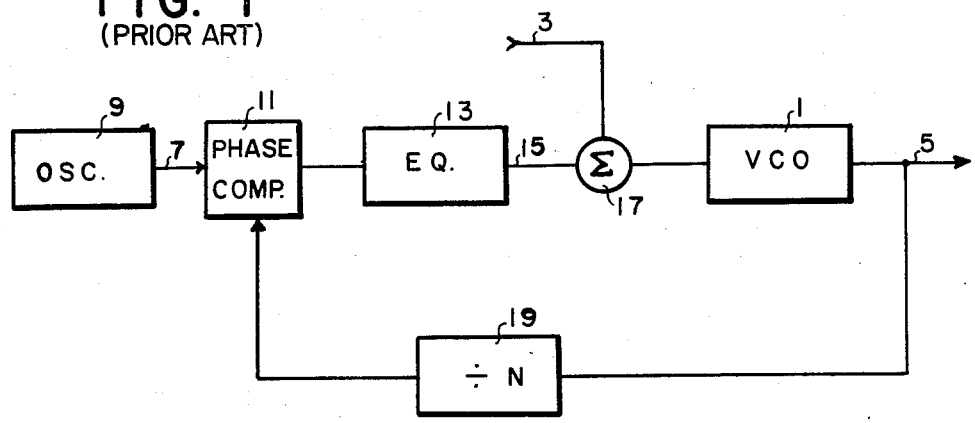
FIG. 1 is a block diagram of a prior art PLL stabilized modulator.

A prior art phase locked loop stabilized modulator is shown in FIG. 1. This modulator is built around a conventional voltage controlled oscillator 1. A voltage varying with time input information signal 3 (such as an analog audio information signal) modulates the voltage at the input of the VCO 1 causing a corresponding frequency modulation of the VCO output signal 5.

To stabilize the center frequency of the VCO output, a portion of the output signal is phase compared with a constant frequency reference signal 7. This reference signal can be generated from a crystal oscillator source 9 or any equivalent constant frequency source. The phase comparator 11 generates an output voltage which is proportional to the phase difference between the reference signal and the VCO output signal. The output of the phase comparator is bandwidth limited in compensation network 13 to produce a stabilizing feedback signal 15 which is summed with the input information signal 3 at summing point 17.

An optional frequency divider 19 may be included in the feedback loop so that the frequency at the phase comparator and the frequency of the reference signal are much less than the center frequency of the output FM signal. This allows the use of a lower bandwidth phase comparator and increases the stable operating range of the feedback loop. However, in order to avoid the introduction of distortion into the modulator output, it is necessary to chose the frequency dividing constant N so that the loop frequency (the frequency of the reference signal 7) is outside of the range of the input information signal 3.

For example, when the input information signal is an audio signal having a bandwidth of 40 Hz to 20 KHz, the loop frequency must be above 20 KHz, but should be as close to 20 KHz as possible to maximize the range of the feedback loop.

In operation, the VCO 1, the frequency divider 19, the phase comparator 11, the reference signal source 9 and the compensation network 13 form a closed feedback loop which phase locks the average VCO output frequency to the reference signal frequency. The loop will stabilize with the phase comparator 11 outputting a voltage which causes the VCO 1 to generate the desired frequency. Any drift in the VCO due to temperature or power supply variations will cause a change in the relative phase between the reference signal and the feedback signal at the phase comparator 11, resulting in a corresponding change in the voltage output by the phase comparator to restore the VCO output frequency to the desired carrier center frequency.

Since the input information signal 3 is summed with the feedback voltage signal 15, it will cause corresponding variations in the output frequency of the VCO 1.

Figure 2:
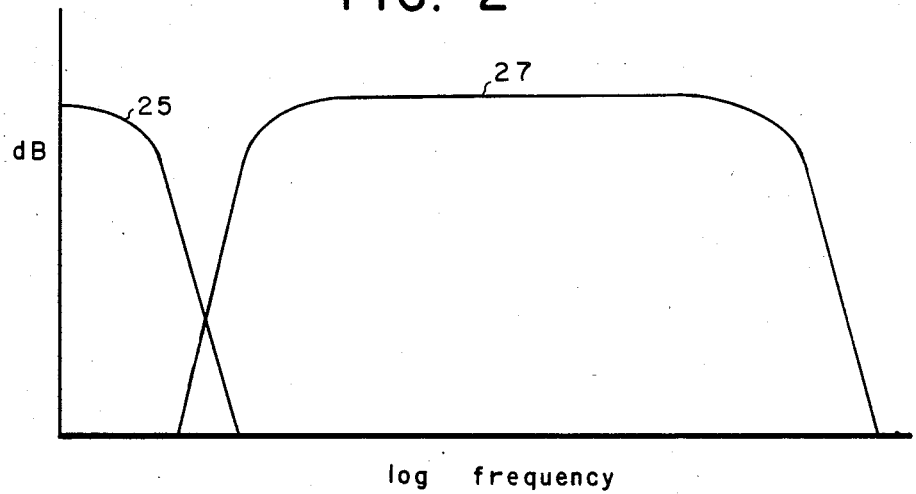
FIG. 2 is a frequency response plot of the phase locked loop showing the frequency range of the input information.

If the bandwidth of the feedback loop was high enough, the frequency variations induced by the information signal 3 would be counteracted by the negative feedback loop. However, as shown in FIG. 2, the response 25 of the feedback loop falls off below the lowest frequency of the frequency range 27 of the input information signal, such that the amplitude of the feedback voltage variations at the information signal frequencies are negligible relative to the amplitude of the information signals themselves.

Conventional phase comparators output a voltage which varies linearly with the phase difference between the two input signals over a range which is normally limited to plus or minus 180° of relative phase error. More complex phase comparators are available with wider ranges, but the improvement is at most a factor of two.

As the input information signal varies from a zero level, the frequency of the output FM modulated signal 5 will vary at a proportion determined by the operating characteristics of the VCO 1. As the frequency of the signal 5 varies, the frequency output by the divider 19 will also vary. Although the divided frequency will vary over a narrower range, the modulation percentage of the divided signal is identical to the modulation percentage of the output signal 5. Accordingly, in order to obtain a plus or minus five percent frequency modulated signal, the phase comparator 11 receives a feedback signal which varies in frequency over the same percentage range. As the frequency of the feedback signal varies instantaneously, the phase error between the reference signal and the feedback signal varies and accumulates. For example, if the output of the VCO 1 is five percent above its stabilized center frequency, the relative phase error between the feedback signal and the reference signal increases by 18° per cycle of the reference signal. The phase error will exceed the linear range of the phase comparator in only ten cycles of the reference signal.

Since the phase error wil continue to increase over the duration of a half cycle of the input information signal, and since the rate of increase of the phase error is proportional to the amplitude of the input information signal, the limited range of the phase comparator limits the low frequency response of the modulator. For a phase comparator with a linear range of plus or minus 180° (plus or minus pi radians), the minimum input information signal frequency at maximum deviation amplitude within the linear range of the phase comparator is equal to the modulation percentage of the VCO times the reference frequency divided by pi. For the above discussed five percent deviation modulator with a reference frequency of 20 KHz, the minimum frequency is approximately 300 Hz. In an audio information system, any lower frequency signals must be attenuated using a high pass filter.

Figure 3:
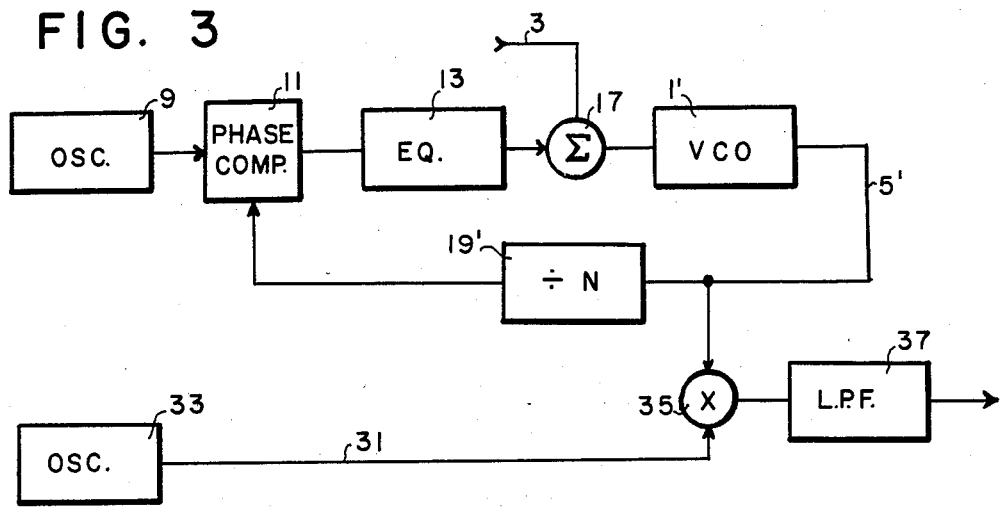
FIG. 3 is a block diagram of the modulator of the present invention.

FIG. 3 shows a block diagram of the improved PLL modulator in accordance with the present invention. In this system, the VCO 1' operates at a much higher frequency than the desired FM carrier center frequency. The output 5' of the VCO 1' is then multiplied with a second constant frequency reference signal 31 from a second reference signal source 33 in a multiplier circuit 35. The output of the multiplier 35 contains one component at a frequency equal to the sum of the frequencies of the signal 5' and the signal 31, and a second component at a frequency which is equal to the difference between the signal 5' and the signal 31. Both components will vary in frequency over a range equal to the modulation range of VCO 1'. By properly selecting the operating center frequency of the VCO 1' and the reference signal 31, so that their difference is equal to the desired FM carrier center frequency, the low frequency component output by the multiplier 35 will be the desired FM carrier signal. A low pass filter 37 can be used to eliminate the other components of the signal output by the multiplier 35.

Because the VCO 1' is operating at a much higher frequency than the VCO of the prior art system but with the same deviation frequency range, the percentage of deviation of the VCO is greatly reduced. Similarly, the percentage of deviation of the feedback signal output by the frequency divider 19' is greatly reduced and the rate of accumulation of phase error in the phase comparator 11 is greatly reduced. Accordingly, the low frequency range of the modulator is increased by a multiple equal to the factor of increase in the VCO center frequency. For example, if the operating frequency of the VCO is made to be five times the desired FM carrier frequency, the modulation of the VCO can be reduced to one percent. With the same reference frequency of 20 KHZ, this will enable linear operation of the phase comparator with full deviation at input information frequencies as low as 60 Hz. If the second reference signal 31 is equal to four times the desired carrier center frequency, the output of the multiplier 35 will consist of one component at the desired carrier center frequency modulated by five percent and a second component at nine times the desired carrier frequency modulated by 0.55 percent. Because these two components are so widely separated, the low pass filter 37 can be very simple, and still very effectively eliminate the higher frequency component.

Naturally, if the operating frequency of the VCO 1' is five times the frequency of the VCO in FIG. 1, the frequency divider 19' must have a division ratio five times higher than the divider 19 of FIG. 1 in order to phase lock the VCO 1' to the same reference signal.

It should be noted that it is also possible to take advantage of frequency translation techniques for extending the range of the prior art modulator of FIG. 1 by frequency shifting the feedback signal between the VCO 1 and the frequency divider 19. This can be done by inserting a signal multiplier (not shown) connected to an appropriate reference signal and by bandpass filtering the output of the multiplier to accept only the higher frequency component of the multiplication and the information carrying side bands. The ratio of the frequency divider 19 is then changed so that the feedback signal is again at the same frequency as the reference signal when the VCO is operating at the desired FM carrier center frequency. Since the deviation range of the VCO and the division ratio of the frequency divider 19 is increased, the frequency modulation range of the feedback signal at the phase comparator 11 is proportionately reduced. This allows a similar increase in the low frequency range of the modulator. However, the bandpass filter required in the feedback loop is more complicated than the low pass filter of the embodiment of FIG. 3 and the positioning of the side bands in certain information systems may prohibit the use of this technique.

Figure 4:
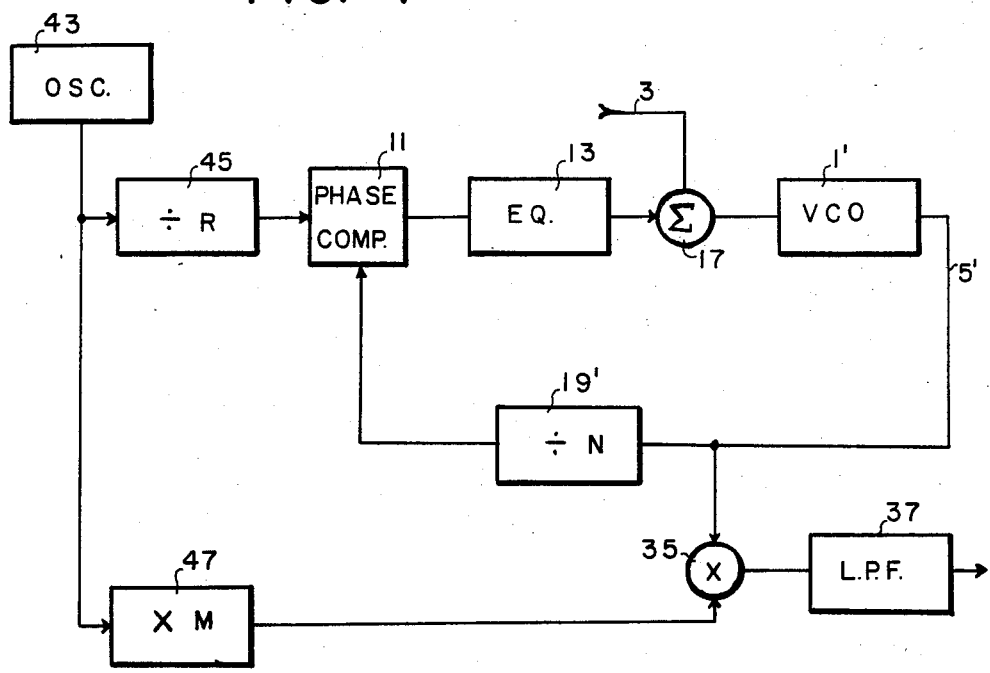
FIG. 4 is a block diagram of a modulator in accordance with the present invention for use in a videodisc recorder.

FIG. 4 shows a variation of the preferred embodiment of the present invention in which both the first and second reference frequencies are derived from a single reference signal. Such a system is particularly useful in generating audio carriers for a video disc recording system because it enables the audio carriers to be frequency stabilized with the video subcarrier reference signal. In a representative embodiment, the 3.58 MHz subcarrier signal is generated by subcarrier reference 43 and is divided by frequency divider 45 to approximately 20 KHz for use as the first reference signal. The subcarrier signal is also frequency multiplied by frequency multiplier 47 to form the second reference signal. If the multiplier 47 increases the frequency by a factor of 6, the second reference signal will have a frequency of 21.47 MHz. In order to generate the first audio carrier at 2.3 MHz, the VCO operates with a center frequency of 19.17 MHz. For the second audio carrier of 2.81 MHz, a separate VCO operates at 18.66 MHz. With the plus or minus 100 KHz modulation range of the audio carriers, the effective modulation percentage at the phase detector is approximately one-half of one percent, giving a full deviation bandwidth for the modulator which goes well below the 40 KHz cutoff range of the video disc audio channels.

Naturally, the frequency modulator may be constructed in a variety of different ways, and the components of the system of the present invention may be arranged in different ways to fit particular applications. Accordingly, it is intended that the invention not be limited by the disclosed embodiments, but only by the appended claims.

I claim:

1. A frequency modulator for producing a carrier signal modulated above and below a desired center frequency in proportion to an information signal, comprising:
   voltage controlled oscillator means responsive to a voltage varying with time information signal for producing an output signal having a frequency varying with the voltage of said information signal;
   reference source means producing first and second reference signals having constant frequencies, the difference between the frequency of said second reference signal and said desired center frequency being a predetermined factor times the frequency of said first reference signal;
   phase locked loop means stabilizing the center frequency of said voltage controlled oscillator at a frequency equal to said predetermined factor times the frequency of the first reference signal, said phase locked loop means having a loop bandwidth below the lowest frequency in said information signal;
   means for multiplying said second reference signal times said output signal to form a product signal; and
   filter means for limiting the bandwidth of the product signal to form said modulated carrier signal.

2. The modulator as claimed in claim 1, wherein said phase locked loop means includes:
   first frequency divider means coupled to said voltage controlled oscillator means for dividing said output signal by said predetermined factor to form a feedback signal;
   phase comparator means for producing an offset signal proportional to the instantaneous phase difference between said first reference signal and said feedback signal;
   compensation means for limiting the bandwidth of said offset signal;
   summing means for combining the bandwidth limited offset signal output by said compensation means with the information signal to control said voltage controlled oscillator.

3. A frequency modulator for producing a carrier signal modulated above and below a desired center frequency in proportion to the instantaneous voltage of an information signal, comprising:
   voltage controlled oscillator means responsive to a voltage varying with time input signal for producing an output signal having a frequency varying with the voltage of said input signal;
   reference source means producing first and second reference signals having constant frequencies, the difference between the frequency of said second reference signal and said desired center frequency being a predetermined factor times the frequency of said first reference signal;
   first frequency divider means coupled to said voltage controlled oscillator means for dividing said output signal by said predetermined factor to form a feedback signal;

phase comparator means for producing an offset signal proportional to the instantaneous phase difference between said first reference signal and said feedback signal;

compensation means for limiting the bandwidth of said offset signal such that the bandwidth of said offset signal is below the lowest frequency in said information signal;

summing means for combining the bandwidth-limited offset signal output by said compensation means with the information signal to form said input signal for controlling said voltage controlled oscillator, said voltage controlled oscillator, said first frequency divider means, said phase comparator means, said compensation means, and said summing means forming a phase locked loop stabilizing the center frequency of said voltage controlled oscillator at a frequency equal to said predetermined factor times the frequency of the first reference signal;

means for multiplying said second reference signal times said output signal to form a product signal; and filter means for limiting the bandwidth of said product signal to form said modulated carrier signal.

4. The modulator as claimed in claim 3, wherein the information signal has a known maximum frequency and wherein the frequency of said first reference signal is higher than said maximum frequency.

5. The modulator as claimed in claim 4, wherein said reference signal source means includes second frequency divider means for forming said first reference signal from an input reference signal.

6. The modulator as claimed in claim 5, wherein said reference signal source means includes frequency multiplier means for forming said second reference signal from said input reference signal.

7. The modulator as claimed in claim 5, wherein said second reference signal is said input reference signal.

8. A frequency modulation method for producing a carrier signal modulated above and below a desired center frequency in proportion to the instantaneous voltage of an information signal, comprising the steps of:

using a voltage controlled oscillator means responsive to a voltage varying with time input signal to produce an output signal having a frequency varying with the voltage of said input signal;

producing first and second reference signals having constant frequencies, the difference between the frequency of said second reference signal and said desired center frequency being a predetermined factor times the frequency of said first reference signal;

frequency shifting said output signal from said voltage controlled oscillator means using the second reference signal to form said modulated carrier signal;

producing a feedback signal having a center frequency lower than the frequency of said output signal from said voltage controlled oscillator by said predetermined factor, whereby the frequency deviation of the feedback signal is the reciprocal of said predetermined factor times the deviation of said carrier signal;

producing an offset signal proportional to the instantaneous phase difference between said first reference signal and said feedback signal;

limiting the bandwidth of said offset signal such that the bandwidth of said offset signal is below the lowest frequency in said information signal; and combining the bandwidth-limited offset signal with the information signal to form said input signal for controlling said voltage controlled oscillator means.

9. The method as claimed in claim 8, wherein said frequency shifting step includes:

multiplying said second reference signal times said voltage controlled oscillator means output signal; and limiting the bandwidth of the resulting product signal.

10. The method as claimed in claim 9, wherein said step of producing a feedback signal includes frequency dividing the output from said voltage controlled oscillator means; and wherein the bandwidth-limited product signal is used as the modulator output.

* * * * *